(12) United States Patent
Masahiro (10) Patent No.: US 8,769,809 B2
(45) Date of Patent: Jul. 8, 2014

(54) METHOD FOR MOUNTING A COMPONENT (75) Inventor: Tanizaki Masahiro, Yokohama (JP)

(73) Assignee: Samsung Techwin Co., Ltd., Changwon (KR)

( * ) Notice: Subject to any disclaimer, the term of this patent is extended or adjusted under 35 U.S.C. 154(b) by 81 days.

(21) Appl. No.: 13/334,137

(22) Filed: Dec. 22, 2011

(65) Prior Publication Data
US 2012/0159781 A1 Jun. 28, 2012

(30) Foreign Application Priority Data

Dec. 22, 2010 (JP) ................................ 2010-285688
Mar. 17, 2011 (KR) ........................ 10-2011-0023822

(51) Int. Cl.
H05K 3/30 (2006.01)
(52) U.S. Cl.
USPC .................... 29/832; 29/833; 29/834; 29/836
(58) Field of Classification Search
USPC ..................................... 29/832, 833, 834, 836
See application file for complete search history.

(56) References Cited

U.S. PATENT DOCUMENTS 4,135,630 A * 1/1979 Snyder et al. ................. 414/627
4,151,945 A * 5/1979 Ragard et al. ................. 228/6.2
4,951,388 A * 8/1990 Eguchi et al. ................. 29/832
6,006,425 A * 12/1999 Fukukura et al. ............. 29/832
6,516,514 B1 * 2/2003 Pruefer ......................... 29/832
7,281,323 B2 * 10/2007 Hwang ......................... 29/834

FOREIGN PATENT DOCUMENTS

JP 2007-165360 A 6/2007
KR 10-2006-0060132 A 6/2006

* cited by examiner

Primary Examiner — Carl Arbes
(74) Attorney, Agent, or Firm — Sughrue Mion, PLLC (57) ABSTRACT A component mounting apparatus including: plural spindles respectively including nozzles, each spindle rotating about a first pivot and each nozzle picking up a component; a head body rotating about a second pivot substantially parallel to a first pivot and rotatably supporting the spindles; and a controller controlling the spindles and the head body to perform: a pickup operation in which the spindle rotates about the first pivot from an initial orientation to a pickup orientation, the nozzle picks up the component, and the spindle rotates from the pickup orientation to the initial orientation so that the component is oriented to a mounting orientation at which the component is to be mounted on a substrate; and a mounting operation in which the picked-up component is transferred to a mounting position of the substrate during which each spindle is retained at the initial orientation.

11 Claims, 6 Drawing Sheets

METHOD FOR MOUNTING A COMPONENT

CROSS-REFERENCE TO RELATED PATENT APPLICATIONS

This application claims priority from Korean Patent Application No. 10-2011-0023822 filed on Mar. 17, 2011 in the Korean Intellectual Property Office and Japanese Patent Application No. 2010-285688 filed on Dec. 22, 2010 in the Japanese Patent Office, the disclosures of which are incorporated herein in their entirety by reference.

BACKGROUND

1. Field

Apparatuses and methods consistent with exemplary embodiments relate to a rotary mounting head unit and operations of mounting a component, and more particularly, to a rotary mounting head unit and operations of mounting an electronic component on a substrate with less errors.

2. Description of the Related Art

In electronic component mounting apparatuses having a related art rotary head, a plurality of axes are controlled to be synchronized to reduce an operating time of the rotary head. JP 06-77693 discloses technology to reduce an operating time by respectively disposing a plurality of pivot motors in nozzle units, apart from a pivot motor of a rotary head, and by synchronously operating the pivot motors. Also, JP P 2008-227249 discloses technology to reduce an operating time by synchronizing a pivot motor of a rotary head and a lever driving unit for lifting a nozzle.

In the above-described related art electronic component mounting apparatuses, a position where an electronic component is to be mounted is adjusted by synchronously operating a spindle, which includes a nozzle, and a head body rotating in conjunction with the operation of the spindle, and then, performing photographing by using a camera. However, if the rotary head is intermittently operated after performing the photographing, a position of an electronic component may be changed due to a mechanistic error that may occur in spindles, thereby resulting in reduction in precision of a mounting position of the electronic component.

SUMMARY

One or more exemplary embodiments provide a component mounting apparatus that includes a plurality of pivots operating cooperatively and may improve precision of locating a mounting position of the component.

According to an aspect of an exemplary embodiment, there is provided a component mounting apparatus which may include: a plurality of spindles respectively including nozzles, each spindle being configured to rotate about a first pivot and each nozzle being configured to pick up a component; a head body which is configured to rotate about a second pivot substantially parallel to a first pivot, and rotatably support the spindles; and a controller which controls the spindles and the head body to rotate about at least one of the first pivot and the second pivot. The controller may perform: a pickup operation in which the spindle rotates about the first pivot from an initial orientation to a pickup orientation with respect to the head body, the nozzle picks up the component, and then, the spindle rotates from the pickup orientation to the initial orientation so that the component is oriented to a mounting orientation at which the component is to be mounted on a substrate; and a mounting operation in which the picked-up component is transferred to a mounting position of the substrate during which each of the spindles is retained at the initial orientation with respect to the head body.

According to an aspect of another exemplary embodiment, there is provided a mounting head unit which may include: a plurality of spindles respectively comprising nozzles, each nozzle being configured to pick up a component and mount the picked-up component on a substrate, each of the spindles being configured to self-rotate about a first pivot; a head body connected to the spindles and configured to rotate about a second pivot; a power transmitting shaft connected to the spindles through a gear; and a controller which controls the head body to rotate about the second pivot, and controls the power transmitting shaft to rotate the spindles about the first pivot. Here, the controller controls the head body and the power transmitting shaft to perform, a pickup operation in which the spindle rotates about the first pivot from an initial orientation to a pickup orientation with respect to the head body, the nozzle picks up the component, and then, the spindle rotates from the pickup orientation to the initial orientation so that the component is oriented to a mounting orientation at which the component is to be mounted on a substrate; and a mounting operation in which the picked-up component is transferred to a mounting position of the substrate during which each of the spindles is retained at the initial orientation with respect to the head body.

BRIEF DESCRIPTION OF THE DRAWINGS

The above aspects will become more apparent by describing in detail exemplary embodiments with reference to the attached drawings, in which.

DETAILED DESCRIPTION OF THE EXEMPLARY EMBODIMENTS

Now, exemplary embodiments according to the inventive concept will be described in detail with reference to the accompanying drawings.

Figure 1:
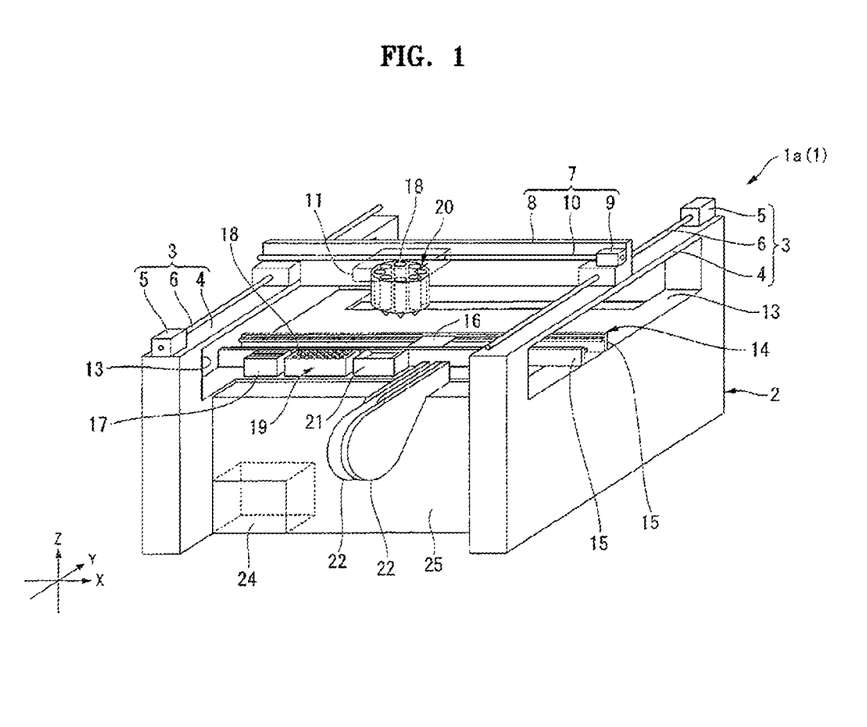
FIG. 1 is a perspective view of an electronic component mounting apparatus, according to an exemplary embodiment.

FIG. 1 is a perspective view of an electronic component mounting apparatus 1, according to an exemplary embodiment.

Referring to FIG. 1, a body 1a of the electronic component mounting apparatus 1 includes first rectilinear motion supporting units 3 disposed at both sides of a table 2 in a horizontal direction, i.e. an X-axis direction, to extend in a lengthwise direction, i.e. in a Y-axis direction. Each first rectilinear motion supporting unit 3 includes a first stage 4, a servo-motor 5, and a ball screw 6 being rotated by the servo-motor 5.

The servo-motor 5 of the first rectilinear motion supporting unit 3 disposed on the left is disposed at a front side of the electronic component mounting apparatus 1, and the servo-motor 5 of the first rectilinear motion supporting unit 3 disposed on the right is disposed at a rear side thereof. Both ends of a second rectilinear motion supporting unit 7 extending in the X-axis direction are respectively screw-coupled to the ball screws 6 of the first rectilinear motion supporting units 3.

The second rectilinear motion supporting unit 7 includes a second stage 8 screw-coupled to the ball screws 6 of the first rectilinear motion supporting units 3, a servo-motor 9, and a ball screw 10. The second stage 8 moves in the Y-axis direction by rotation of the ball screws 6 of the first rectilinear motion supporting units 3.

The second rectilinear motion supporting unit 7 includes the ball screw 10 driven by the servo-motor 9 formed on the right side of the electronics component mounting apparatus 1. The ball screw 10 is screw-coupled to a joint block 11. An electronic component is attached to the joint block 11 by air pressure, and the joint block 11 supports a nozzle head 20 including eight nozzles 18 releasing the attached electronic component.

Two openings 13 are respectively formed in the first rectilinear motion supporting units 3 in the Y-axis direction, and a substrate transfer device 14 extending in the X-axis direction is disposed at a front side of the table 2 to be placed in the openings 13.

The substrate transfer device 14 includes a pair of rails 15, and a substrate 16 on which the electronic component is mounted is transferred on the rails 15 in the X-axis direction. The electronic component attached to the nozzles 18 is mounted on a predetermined mounting position of the substrate 16 disposed on the substrate transfer device 14.

In FIG. 1, an electronic component discarding box 17 into which a discarded element is collected, a nozzle station 19 for accommodating the nozzles 18, and a camera 21 for photographing the nozzle head 20 when light is emitted onto the nozzle head 20 from the bottom, are sequentially disposed at an upper front side of the table 2. The camera 21 photographs the nozzle head 20 from the bottom to examine a position and an orientation of the electronic component attached to the nozzles 18 or generation of defects.

In FIG. 1, a plurality of tape feeders 22 for feeding the electronic component to be mounted on the substrate 16 are arranged on the right of the camera 21 in the X-axis direction, but only one pair of tape feeders 22 are shown in FIG. 1. Each of the tape feeders 22 supports a tape reel (not shown) and dispose the electronic component (not shown) unreeled from the tape reel in a position where the nozzle head 20 is approachable.

The electronic component is attached to the nozzles 18 of the nozzle head 20, and is mounted on a position where the electronic component is to be mounted on the substrate 16 disposed on the substrate transfer device 14.

Figure 2:
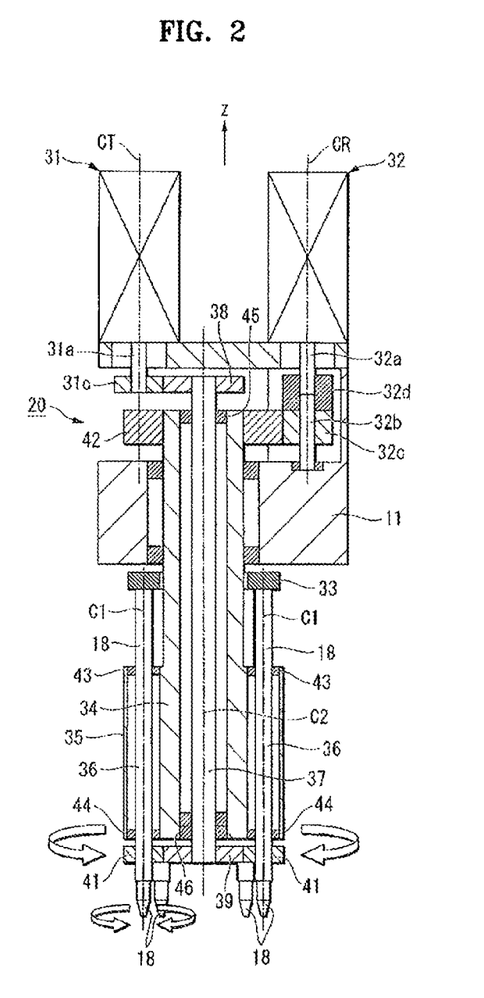
FIG. 2 is a cross-sectional view of a nozzle head of the electronic component mounting apparatus of FIG. 1, according to an exemplary embodiment.

FIG. 2 is a cross-sectional view of the nozzle head 20 of the electronic component mounting apparatus 1 of FIG. 1.

Referring to FIG. 2, the nozzle head 20 rotatably support the spindles 36 and the nozzles 18 by an operation of a T-axis motor 31 in a rotation direction of a first pivot C1 passing through a center of each nozzle 18 extending in a Z-axis direction and rotates the nozzles 18 by an operation of an R-axis motor 32 in a rotation direction of a second pivot C2 passing through a center of the nozzle head 20 extending in the Z-axis direction.

By cooperation between the nozzle head 20 having the above-described structure, the first rectilinear motion supporting units 3 and the second rectilinear motion supporting unit 7, any one of the nozzles 18 is disposed above the above-described position where the electronic component is attached to the nozzles 18 or the above-described position where the electronic component is to be mounted, and also the position of each nozzle 18 is adjusted at an arbitrary angle with respect to a center of the first pivot C1 or the second pivot C2.

In the nozzle head 20, any one of the nozzles 18 is disposed above the position where an element is attached, and the nozzle 18 is lowered by an operation of a lifting member 33 so that the electronic component is attached to the nozzle 18. Then, the nozzle head 20 raises the nozzle 18 to which the electronic component has been attached by the operation of the lifting member 33, and the nozzle 18 and the electronic component are disposed above the position where the electronic component is to be mounted. Then, the nozzle head 20 lowers the nozzle 18 to which the electronic component has attached by the operation of the lifting member 33 to mount the electronic component on the substrate 16.

The body 1a includes a controller 24 for controlling the whole operation of the electronic component mounting apparatus 1 including the first rectilinear motion stages 3, the second rectilinear motion stage 7, and the nozzle head 20, wherein the controller 24 is disposed at a lower front side of the table 2 of FIG. 1. Also, a cart accommodation portion 25 for accommodating an element supplying cart (not shown) on which the tape feeders 22 are mounted is disposed on the right of at the lower front side of the table 2, wherein the cart accommodation portion 25 is formed to have a recessed shape.

The nozzle head 20 illustrated in FIG. 2 has a cylindrical shape in a Z-axis direction and includes a head body 34, which has a cylindrical shape and is supported by the joint block 11 in a direction of the second pivot C2 to be capable of rotating, and a plurality of nozzles 18 disposed at equal intervals in a circumferential direction centering around the second pivot C2. A plurality of spindles 36 are disposed on a lower outer circumference of the head body 34 to extend in the Z-axis direction, wherein the spindle 36 has a rod shape. The head body 34 rotatably supports the spindles 36 about the first pivot C1. Each of the nozzles 18 is disposed at a lower end portion of each of the spindles 36.

A body tube 35, which is hollow, is disposed on a lower outer circumference of the head body 34 to be capable of rotating integrally with the head body 34. Upper and lower portions of each spindle 36 are respectively supported by upper and lower walls of the body tube 35 to be capable of rotating in a rotation direction of the first pivot C1 and to be lifted along the first pivot C1.

Also, the nozzle head 20 includes a power transmission shaft 37 penetrating the head body 34, an input gear 38 disposed to be capable of rotating integrally with an upper end of the power transmission shaft 37, an output gear 39 disposed to be capable of rotating integrally with a lower end of the power transmission shaft 37 and rotating coaxially with the power transmission shaft 37, and the T-axis and R-axis motors 31 and 32 that respectively have driving center axes CT and CR extending in the Z-axis direction and are disposed at an upper portion of the joint block 11.

The T-axis and R-axis motors 31 and 32 are disposed in such a way that their respective drive axes 31a and 32a protrude downward. A pinion gear 31c is disposed on an outer circumference of the drive axis 31a to be capable of rotating integrally with the drive axis 31a and to be engaged with the input gear 38 having a relatively large diameter. A drive force of the T-axis motor 31 is transmitted to the power transmission shaft 37 through a first reduction gear pair including the pinion gear 31c and the input gear 38. The drive force is transmitted to each spindle 36 through a second reduction gear pair including the output gear 39 and a nozzle drive gear 41 which will be described later. The spindle 36 rotates about the first pivot C1.

A relay axis 32b is disposed coaxially with the drive axis 32a under the drive axis 32a of the R-axis motor 32 and is engaged with the drive axis 32a to be capable of rotating integrally with the drive axis 32a. The pinion gear 32c is disposed on an outer circumference of the relay axis 32b to be capable of rotating integrally and coaxially with the relay axis 32b. Also, the pinion gear 32c is engaged with a head drive gear 42 having a relatively large diameter and disposed on an upper outer circumference of the head body 34 to be capable of rotating integrally and coaxially with the head body 34. A drive force of the R-axis motor 32 is transmitted to the head body 34 through a third reduction gear pair including the pinion gear 32c and the head drive gear 42. The head body 34 rotates about the second pivot C2.

Reference numeral 32d denotes a ball bearing unit supporting a contact portion between the drive axis 32a and the relay axis 32b, wherein the ball bearing unit may include a plurality of rows of balls (not shown).

Figure 3A:
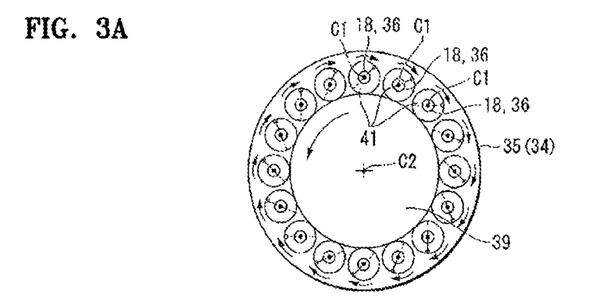
FIG. 3A is a cross-sectional view of a nozzle head in an axial direction when only a T-axis motor is driven in the electronic component mounting apparatus of FIG. 1, according to an exemplary embodiment.

FIG. 3A is a cross-sectional view of the nozzle head 20 in an axial direction when only the T-axis motor 31 is driven in the electronic component mounting apparatus of FIG. 1.

The nozzle drive gears 41 are respectively disposed at lower portions of the spindles 36 to be capable of rotating integrally and coaxially with the spindles 36, and the nozzle drive gears 41 are engaged with the output gear 39. Thus, if the R-axis motor 32 stops and only the T-axis motor 31 is driven, the spindles 36 and the nozzles 18 rotate about the respective first pivots C1.

Figure 3B:
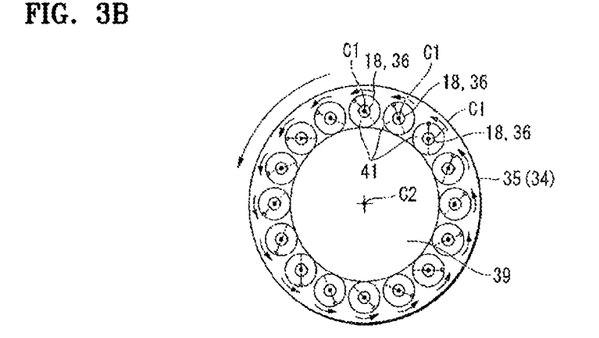
FIG. 3B is a cross-sectional view of a nozzle head in an axial direction when only an R-axis motor is driven in the electronic component mounting apparatus of FIG. 1, according to an exemplary embodiment.

FIG. 3B is a cross-sectional view of the nozzle head 20 in an axial direction when only the R-axis motor 32 is driven in the electronic component mounting apparatus of FIG. 1.

If the T-axis motor 31 stops and only the R-axis motor 32 is driven, the output gear 39 stops, the head body 34 and the body tube 35 rotate about the second pivot C2, the spindles 36 and the nozzles 18 rotate about the second pivot C2, and the nozzle drive gears 41 rotate along an outer circumference of the output gear 39 to transmit power, and thus, the spindles 36 and the nozzles 18 rotate about the respective first pivots C1.

Figure 3C:
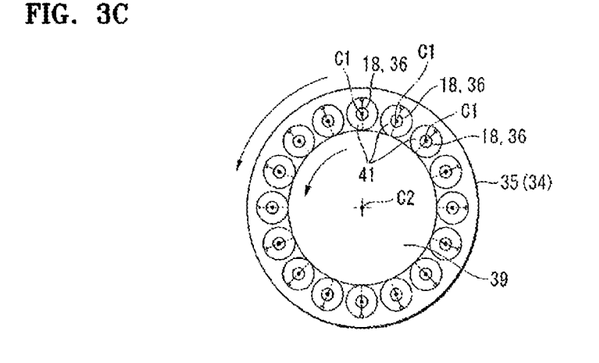
FIG. 3C is a cross-sectional view of a nozzle head in an axial direction when the T-axis motor and the R-axis motor are driven in the electronic component mounting apparatus of FIG. 1, according to an exemplary embodiment.

FIG. 3C is a cross-sectional view of the nozzle head 20 in an axial direction when the T-axis motor 31 and the R-axis motor 32 are driven in the electronic component mounting apparatus of FIG. 1.

Also, if the T-axis motor 31 and the R-axis motor 32 are synchronously-driven so that both the head body 34 (the head drive gear 42) and the power transmission shaft 37 (the input gear 38) rotate at the same speed about the second pivot C2, the nozzle drive gears 41 do not rotate along an outer circumference of the output gear 39 due to the rotation movement of the output gear 39 (that is, the spindles 36 and the nozzles 18 do not rotate about the respective first pivots C1), and the spindles 36 and the nozzles 18 rotate about the second pivot C2 at the same speed as the head body 34 and the body tube 35.

An upper portion of each spindle 36 is supported by an upper wall of the body tube 35 through a radial ball bearing 43 (roughly shown in FIG. 2), and a lower portion of each spindle 36 is supported by a lower wall of the body tube 35 through a radial ball bearing 44 (roughly shown in FIG. 2).

Also, an upper portion of the power transmission shaft 37 is supported by an upper inner circumference of the head body 34 through a heat upper radial ball bearing 45 (roughly shown in FIG. 2), and a lower portion of the power transmission shaft 37 is supported by a lower inner circumference of the head body 34 through a head lower radial ball bearing 46 (roughly shown in FIG. 2).

Figure 4A:
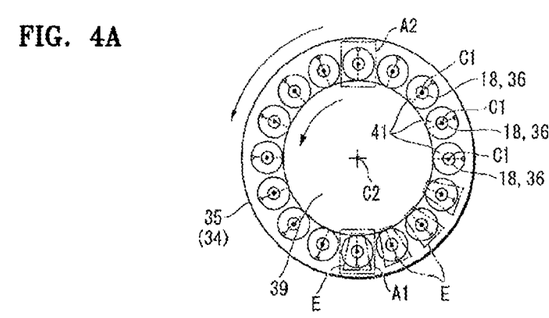
FIG. 4A is a cross-sectional view of nozzles to which an electronic component is attached when a T-axis motor and an R-axis motor are synchronously-driven in the nozzle head illustrated in FIGS. 3A and 3B, according to an exemplary embodiment.
Figure 4B:
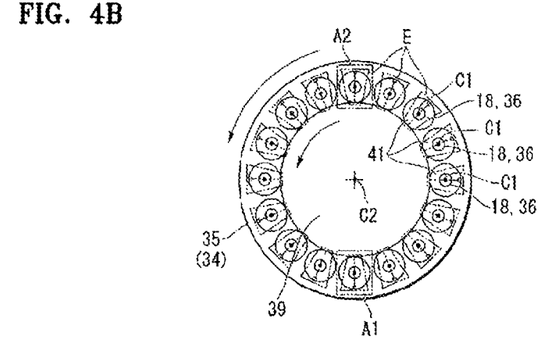
FIG. 4B is a cross-sectional view of nozzles to which an electronic component is attached when a T-axis motor and an R-axis motor are synchronously-driven in the nozzle head illustrated in FIGS. 3A and 3B, according to an exemplary embodiment.

FIG. 4A is a cross-sectional view of the nozzles 18 to which electronic component E is attached when the T-axis motor 31 and the R-axis motor 32 are synchronously-driven in the nozzle head 20 as illustrated in FIG. 3C. FIG. 4B is a cross-sectional view of the nozzles 18 to which the electronic components E are attached when the T-axis motor 31 and the R-axis motor 32 are synchronously-driven in the nozzle head 20 as illustrated in FIG. 3C.

In FIG. 4A, the nozzles 18 and the head body 34 are synchronously-rotating when rotating angles of the head body 34 with respect to the nozzles 18 are equal, and thus, the electronic component E is attached to the nozzles 18 in an element attachment position A1. In FIG. 4A, respective positions of the electronic component Es attached to the nozzles 18 are the same with respect to the nozzles 18 supporting the electronic components E.

Figure 4C:
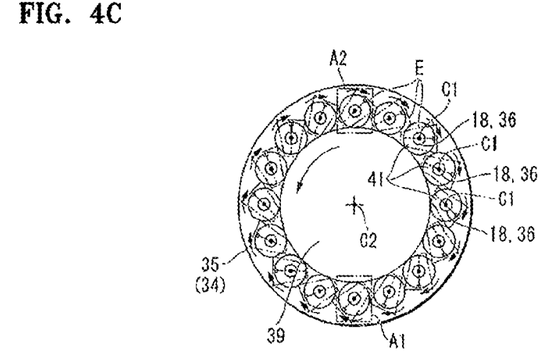
FIG. 4C is a cross-sectional view of nozzles and an electronic component which is rotating by driving only a T-axis motor after the electronic component is attached to the nozzles, according to an exemplary embodiment.

FIG. 4C is a cross-sectional view of the nozzles 18 and the electronic components E which are rotated by driving only the T-axis motor 31 after the electronic components E are attached to the nozzles 18.

The camera 21 captures images of the nozzle head 20 in which the electronic component E is attached to the nozzles 18 below the nozzle head 20. Examination for the positions of the electronic component E attached to the nozzles 18 is performed by using information regarding the imaging performed by the camera 21. After the examination is performed, the electronic component E attached to the nozzles 18 is mounted on the substrate 16 in an element mounting position A2.

When an orientation of the electronic component E attached to the nozzles 18 is different from an orientation by which the electronic component E is to be mounted, the orientation of the electronic component E needs to be adjusted by performing an imaging examination by using the camera 21 and then differentially driving the T-axis motor 31 and the R-axis motor 32 to rotate the nozzles 18 about the second pivot C2.

However, if the imaging examination is performed by using the camera 21 and then rotating the nozzles 18, an error may occur in the position of the electronic component E due to a mechanistic error that may occur with respect to the nozzles 18. The mechanistic error includes a shaking error due to rotation of the spindle 26, a shaking error occurring in a bearing, and the like.

Figure 5A:
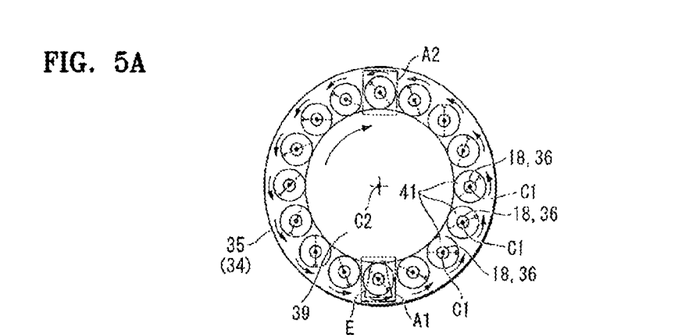
FIG. 5A is a cross-sectional view of nozzles which are rotating by driving only a T-axis motor in a reverse direction and an electronic component is attached to first nozzles in the nozzle head illustrated in FIGS. 3A and 3B, according to an exemplary embodiment.

FIG. 5A is a cross-sectional view of the nozzles 18 which are rotated by driving only the T-axis motor 31 in a reverse direction and the electronic component E is attached to a first nozzle in the nozzle head 20 as illustrated in FIG. 3A.

Figure 5B:
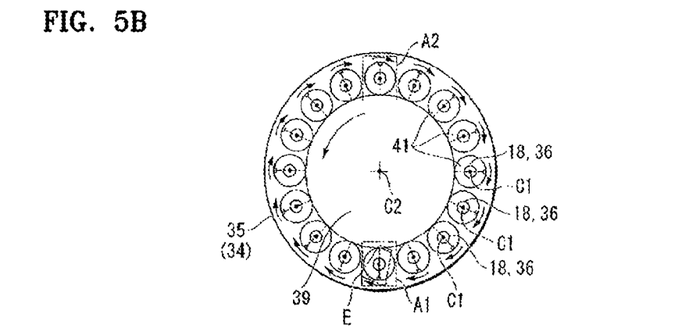
FIG. 5B is a cross-sectional view of nozzles which are rotating by driving only a T-axis motor in a normal direction after an electronic component is attached to first nozzles in the nozzle head illustrated in FIGS. 3A and 3B, according to an exemplary embodiment.

FIG. 5B is a cross-sectional view of the nozzles 18 which are rotated by driving only the T-axis motor 31 in a normal direction after the electronic component E is attached to the first nozzle in the nozzle head 20 as illustrated in FIG. 3A.

The current embodiment can prepare for a case where a mounting orientation of the electronic component E at which the electronic component E is mounted on a substrate is different from an pickup orientation of the electronic component E at which the electronic component E is picked up by the nozzles 18. For this purpose, the nozzles 18 are rotated at a predetermined angle in a reverse direction to pickup orientations from their initial orientations with respective to the head body 34 by considering the mounting orientation of the electronic component E. Then the nozzle picks up the electronic component E (refer to FIG. 5A). After picking up the electronic component E, the nozzles 18 are rotated in a forward direction to be returned to their initial orientations from the pickup orientations with respective to the head body 34 (refer to FIG. 5B). Hereinafter, a series of operations of the nozzles 18 picking up the electronic component E are referred to as a pickup operation.

Figure 5C:
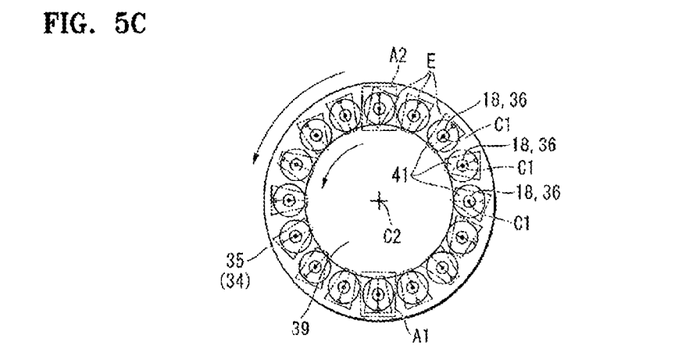
FIG. 5C is a cross-sectional view of nozzles which are rotating by synchronously-driving motors after attachment of an electronic component to the nozzles has completed by repeating the operations illustrated in FIGS. 5A and 5B, according to an exemplary embodiment.

FIG. 5C is a cross-sectional view of the nozzles 18 which are rotated by synchronously-driving motors after attachment of the electronic components E is completed by repeating the operations illustrated in FIGS. 5A and 5B. The pickup operation is performed sequentially for each of the nozzles 18.

The electronic component E is sequentially attached to the nozzles 18 with the mounting orientation at which the electronic component E is mounted on a substrate, by repeating the series of operations of the above-described pickup operation with respect to the nozzles 18 (refer to FIG. 5C).

Then, after examination with respect to the electronic component E is performed by capturing images of the nozzle head 20 by using the camera 21, the nozzle head 20 is moved to the component mounting position A2 to be mounted on a substrate (not shown). Hereinafter, a series of operations for mounting the electronic component E are referred to as a mounting operation. When the mounting operation is performed, an orientation of the electronic component E supported by the nozzles 18 of the nozzle head 20 which are retained at their initial orientations, i.e. an orientation of the electronic component E at which the nozzles 18 holds the electronic component E is the same as the mounting orientation by which the electronic component E is to be mounted on a substrate, and thus, the electronic component E may be mounted by lowering the nozzles 18 with respect to the substrate without rotating the nozzles 18.

The nozzles 18 do not need to rotate to be adjusted to be in the mounting orientation by which the electronic component E is mounted on the substrate (not shown) after performing the imaging examination, and thus, precision of a position where the electronic component E is mounted is prevented from deteriorating due to, for example, a mechanistic error occurring in the nozzles 18, thereby minimizing a change in a relative position of the electronic component E from when imaging the electronic component E to when mounting the electronic component E that may occur due to the nozzles 18 rotating in a reverse direction.

According to the current embodiment, the nozzles 18 may be rotated in conjunction with the head body 34 by synchronously-driving driving units, and thus, the electronic component E may be mounted in an component mounting position without rotating the spindles 36 after performing the imaging examination by using the camera 21, thereby improving precision of a position where the electronic component E is mounted because an error due to, for example, a mechanistic error, does not occur in the spindles 36 after performing an imaging examination by using the camera 21.

As described above, the pickup operation is performed when the nozzles 18 are rotated at a predetermined angle by considering an orientation by which the electronic component E is to be mounted in the element mounting position A2, and thus, an orientation of the electronic component E attached to the nozzles 18 is already the same as an orientation by which the electronic component E is to be mounted in the element mounting position A2 when performing a mounting operation of the electronic component E. At this time, an operation for performing the mounting operation of the electronic component E without rotating the nozzles 18 is performed, which is referred to as a "precision preferred mode".

Figure 6:
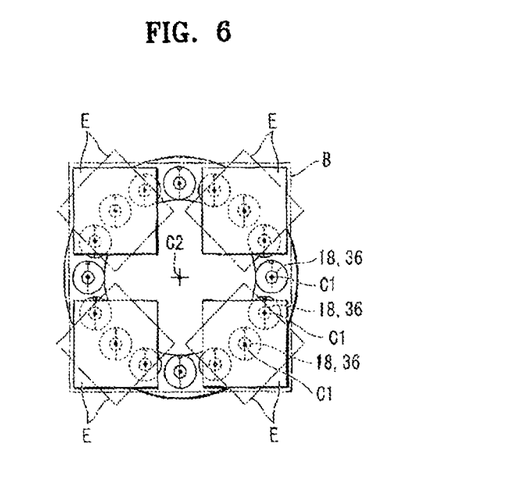
FIG. 6 is a view of a nozzle head to which an electronic component is attached in the electronic component mounting apparatus of FIG. 1 when seen from a camera, according to an exemplary embodiment.

FIG. 6 is a view of the nozzle head 20 to which the electronic component E is attached in the electronic component mounting apparatus of FIG. 1 when seen from the camera 21.

As described above, in the precision preferred mode in which precision of a mounting position of the electronic component E is preferred, when driving units are synchronously-driven in order to rotate the nozzles 18, unnecessary parts may be easily generated in an imaging field of view B of the camera 21, thereby reducing a size of the electronic component E capable of being imaged at a time by using the imaging field of view B of the camera 21.

In order to effectively utilize the limited imaging field of view of the camera 21, the nozzle head 20 may be rotated to maintain an orientation in which the electronic component E is attached to be in a particular orientation. The maintaining of the orientation in which the electronic component E is attached to be in the particular orientation means that an orientation of the nozzles 18 when the electronic component E is attached to the nozzles 18 is set to rotate the nozzles 18 within a range of predetermined angles or that the nozzles 18 are not rotated from their initial orientations so that the electronic component E attached to the nozzles 18 is included in the imaging field of view B of the camera 21.

As such, a function of preferentially controlling a function of securing the imaging field of view B of the camera 21 prior to a function of securing precision of a position where the electronic component E is mounted is referred to as an "imaging preferred mode". In the imaging preferred mode, a rotation movement about the first pivot C1 with respect to a rotation movement about the second pivot C2 is adjusted by synchronously-driving the first pivot C1 and the second pivot C2 so that an image of the electronic component E is exactly included in the imaging field of view B.

For example, in a square electronic component E illustrated in FIG. 6, a size of the electronic component E may be imaged up to $\sqrt{2}$ times at a time. That is, imaging may be effectively performed by effectively utilizing the limited imaging field of view B of the camera 21. The electronic component mounting apparatus 1 may selectively perform any one of a precision preferred mode in which precision of a position where the electronic component E is mounted in the nozzle head 20 is preferentially secured and an imaging preferred mode in which the imaging field of view B of the camera 21 is preferentially secured in order to effectively recognize the electronic component E.

According to a rotary mounting head unit and a method and apparatus for mounting an electronic component, nozzles may be optimally rotated in conjunction with a head body by synchronously-driving driving units. For example, the electronic component may be mounted in an element mounting position without rotating spindles after performing imaging examination of the electronic component supported by the nozzles, thereby improving precision of a position where the electronic component is mounted because a change in a position due to, for example, a mechanistic error, does not occur in the spindles after performing an imaging examination. Also, an image may be effectively obtained by rotating the spindles in order to effectively utilize an imaging field of view during the imaging examination.

While the inventive concept has been particularly shown and described with reference to exemplary embodiments thereof, it will be understood by those of ordinary skill in the art that various changes in form and details may be made therein without departing from the spirit and scope of the inventive concept as defined by the following claims.

What is claimed is:

1. A method of mounting a component using an apparatus comprising a plurality of spindles respectively comprising nozzles, each of which is configured to rotate about a first pivot provided at a center of the each spindle, a head body which is configured to rotate about a second pivot provided at a center of the head body and substantially parallel to the first pivot, and the head body configured to rotatably support the spindles, and a controller configured to control the spindles and the head body to perform the method, the method comprising:
    performing a pickup operation comprising:
        rotating the spindle about the first pivot from an initial orientation to a pickup orientation with respect to the head body;
        picking up the component; and
        rotating the spindle from the pickup orientation to the initial orientation so that the component is oriented to a mounting orientation at which the component is to be mounted on a substrate,
        wherein the rotating the spindle about the first pivot from the initial orientation to the pickup orientation occurs before the picking up the component; and
    performing a mounting operation comprising transferring the picked-up component to a mounting position of the substrate during which each of the spindles is retained at the initial orientation with respect to the head body.

2. The method of claim 1, further comprising controlling a first power device configured to rotate the spindles about the first pivot, and a second power device configured to rotate the head body about the second pivot,
    wherein the controlling operation comprises controlling both the first power device and the second power device during the mounting operation.

3. The method of claim 2, wherein, by controlling both the first power device and the second power device to perform the mounting operation, both the head body and the spindles rotate about the second pivot and the spindles rotate about the first pivot, during the mounting operation.

4. The method of claim 1, wherein the performing pickup operation comprises:
    controlling both the head body and the spindles to rotate about the second pivot and controlling the spindles not to rotate about the first pivot, during the mounting operation.

5. The method of claim 1, wherein the pickup operation comprises:
    rotating the spindle about the first pivot by a predetermined angle from the initial orientation so that the spindle is set to the pickup orientation;
    controlling each of the nozzles to pick up the component while the spindle is set to the pickup orientation; and
    rotating the spindle to be set to the initial orientation.

6. The method of claim 5, wherein the mounting operation comprises synchronously-rotating the spindles and the head body about the second pivot while the spindles maintain their initial orientations with respect to the head body.

7. The method of claim 1, wherein the mounting operation comprises synchronously-rotating the spindles and the head body about the second pivot while the spindles maintain their initial orientations with respect to the head body.

8. The method of claim 1, wherein the rotating the spindle from the pickup orientation to the initial orientation comprises rotating the spindle from the pickup orientation to the initial orientation about the first pivot.

9. The method of claim 1, wherein the rotating the spindle from the pickup orientation to the initial orientation occurs after the picking up the component and before the performing the mounting operation.

10. The method of claim 1, wherein the performing the pickup operation is performed before the performing the mounting operation.

11. A method of mounting a component using an apparatus comprising a plurality of spindles respectively comprising nozzles and configured to rotate about a first pivot provided at a center of the each spindle, a head body configured to rotate about a second pivot provided at a center of the head body, and the head body configured to support the spindles rotatably, a power transmitting shaft connected to the spindles through a gear, and a controller configured to control the spindles and the head body to perform the method, the method comprising:
    controlling the head body to rotate about the second pivot and the spindles to rotate about the first pivot;
    if the power transmitting shaft rotates the gear about the second pivot in a first rotational direction when the head body does not rotate about the second pivot in any rotational direction, controlling the spindles to rotate about the first pivot in a second rotational direction opposite to the first rotational direction due to connection between the spindles and the gear,
    if the head body rotates about the second pivot in the first rotational direction when the gear does not rotate about the second pivot in any rotational direction, controlling the spindles to rotate about the first pivot in the first rotational direction due to the connection between the spindles and the gear, and controlling the spindles to rotate along with the head body about the second pivot in the first rotational direction due to connection between the spindles and the gear, and
    if both the head body and the gear rotate about the second pivot in the first rotational direction, controlling the spindles not to rotate about the first pivot and to rotate about the second pivot in the first rotational direction due to the connections between the head body, the spindles and the gear so that the spindles retain their orientations with respect to the head body.

\* \* \* \* \*